United States Patent
Belady et al.

(10) Patent No.: US 7,327,569 B2
(45) Date of Patent: Feb. 5, 2008

(54) PROCESSOR MODULE WITH THERMAL DISSIPATION DEVICE

(75) Inventors: Christian L. Belady, McKinney, TX (US); Gary W. Williams, Rowlett, TX (US); Shaun L. Harris, McKinney, TX (US); Steven A. Belson, Plano, TX (US); Eric C. Peterson, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 368 days.

(21) Appl. No.: 11/011,328

(22) Filed: Dec. 13, 2004

(65) Prior Publication Data

US 2006/0126297 A1 Jun. 15, 2006

(51) Int. Cl.
*H05K 7/20* (2006.01)
(52) U.S. Cl. ........... 361/699; 165/104.33; 165/80.4; 174/261; 361/700; 361/702
(58) Field of Classification Search ............... None
See application file for complete search history.

(56) References Cited

U.S. PATENT DOCUMENTS

| | | | |
|---|---|---|---|
| 5,801,924 A | * | 9/1998 | Salmonson ............ 361/719 |
| 6,304,450 B1 | * | 10/2001 | Dibene et al. ............ 361/704 |
| 6,356,448 B1 | * | 3/2002 | DiBene et al. ............ 361/721 |
| 6,452,113 B2 | * | 9/2002 | Dibene et al. ............ 174/260 |
| 6,452,804 B1 | * | 9/2002 | Dibene et al. ............ 361/720 |
| 6,771,507 B1 | | 8/2004 | Belady et al. |
| 6,816,378 B1 | | 11/2004 | Belady et al. |
| 6,819,562 B2 | | 11/2004 | Boudreaux et al. |
| 7,005,586 B1 | * | 2/2006 | Duley ............ 174/261 |

OTHER PUBLICATIONS

David A. Klein, U.S. Appl. No. 10/800,837 filed Mar. 15, 2004, entitled "Multi-Processor Module".

* cited by examiner

*Primary Examiner*—Gregory D. Thompson

(57) ABSTRACT

Embodiments include apparatus, methods, and systems of a processor module for a system board. An electronic module is removably connectable to a system board. The electronic module has first and second portions. The first portion is connected to the system board and includes a thermal dissipation device and a printed circuit board (PCB) with a processor connected to a first side of the PCB. The thermal dissipation device extends between the processor and the system board. The second portion connects on top of the first portion and has a power system board for providing power to the processor. The power system board extends adjacent and parallel to a second side of the PCB.

19 Claims, 3 Drawing Sheets

PROCESSOR MODULE WITH THERMAL DISSIPATION DEVICE

BACKGROUND

Some electronic systems utilize several printed circuit boards with many different electronic components interconnected to the circuit boards. As these electronic systems decrease in size and increase in performance, packing density, heat dissipation, and power distribution architecture become increasingly important.

One way to increase packing density and reduce the actual size of an electronic device is to more closely position the electrical components together. Electrical components within a circuit board, however, are generally already tightly confined, and additional space may not be readily available. If, however, electrical components can be positioned to reduce the overall size of the electronic device, then significant savings and advantages can be realized.

As electrical components are more densely packed together and as performance of these components increases, heat dissipation can become a more significant factor in many electronic systems. Circuit boards may include a plurality of heat-generating devices that must be cooled in order to operate within a specified operating temperature. If these heat-generating devices are not sufficiently cooled, then the devices can exhibit a decrease in performance or even permanently fail. Further, if the heat-generating devices are closely packed together, then heat from one device could affect the performance of an adjacent device.

The design and layout of printed circuit board components can be quite complex and challenging. Designers must consider many factors, such as packing density and heat dissipation, to name a few examples. Improvements in these areas can realize significant benefits for electronic systems and devices.

SUMMARY

Embodiments include apparatus, methods, and systems of a processor module for a system board. An electronic module is removably connectable to a system board. The electronic module has first and second portions. The first portion is connected to the system board and includes a thermal dissipation device and a printed circuit board (PCB) with a processor connected to a first side of the PCB. The thermal dissipation device extends between the processor and the system board. The second portion connects on top of the first portion and has a power system board for providing power to the processor. The power system board extends adjacent and parallel to a second side of the PCB.

In another exemplary embodiment, a method comprises connecting a first portion of an electronic module to a printed circuit board (PCB), the first portion having a thermal dissipation device and a processor board with plural processors; connecting a second portion of the electronic module on top of the first portion so a power board in the second portion is back-to-back with the processor board; and dissipating heat away from the plural processors with the thermal dissipation device.

Other embodiments and variations of these embodiments are shown and taught in the accompanying drawings and detailed description.

DETAILED DESCRIPTION

Figure 1:
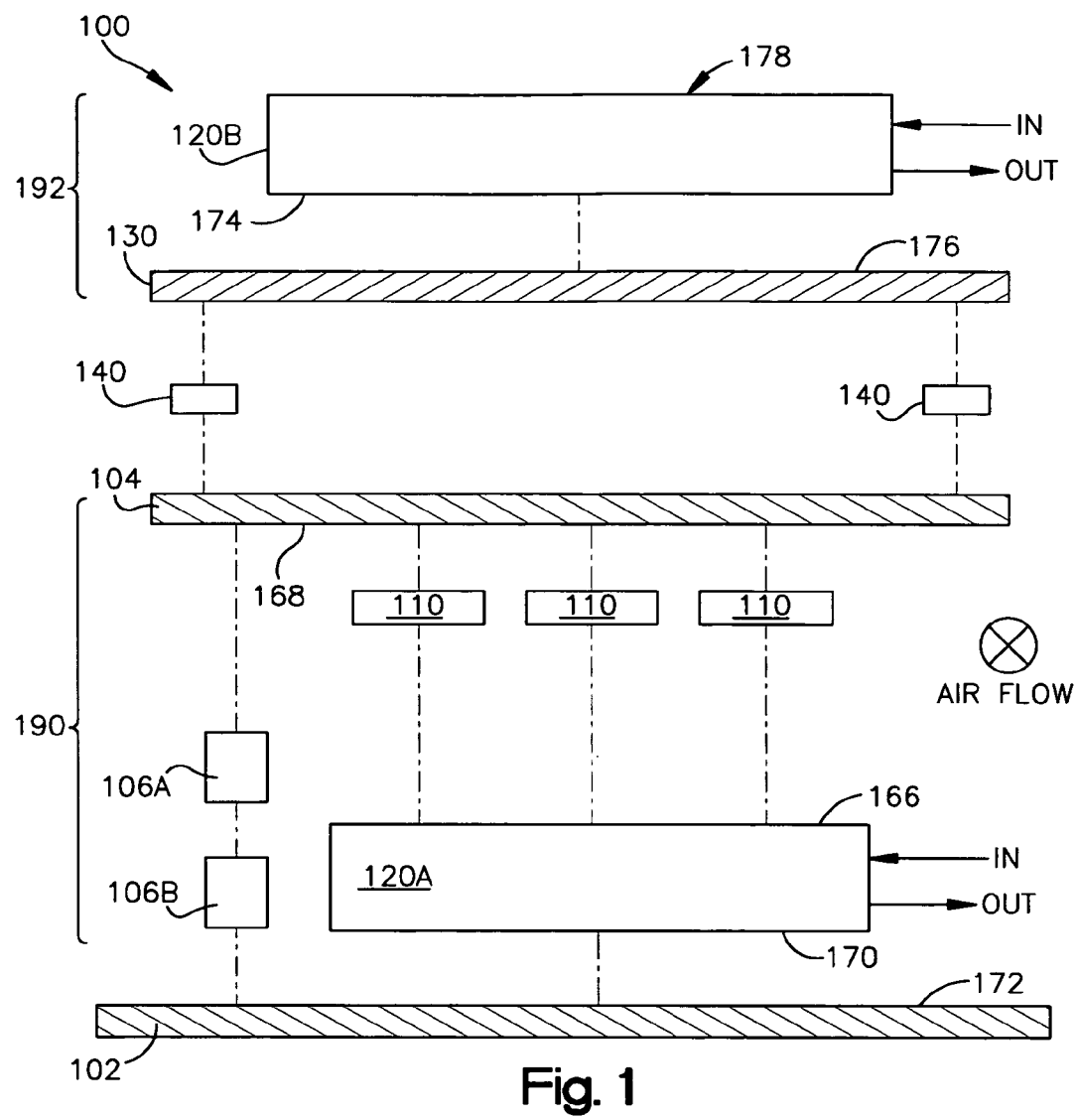
FIG. 1 is an exploded side view of a block diagram of an electronic assembly in accordance with an exemplary embodiment of the present invention.
Figure 2:
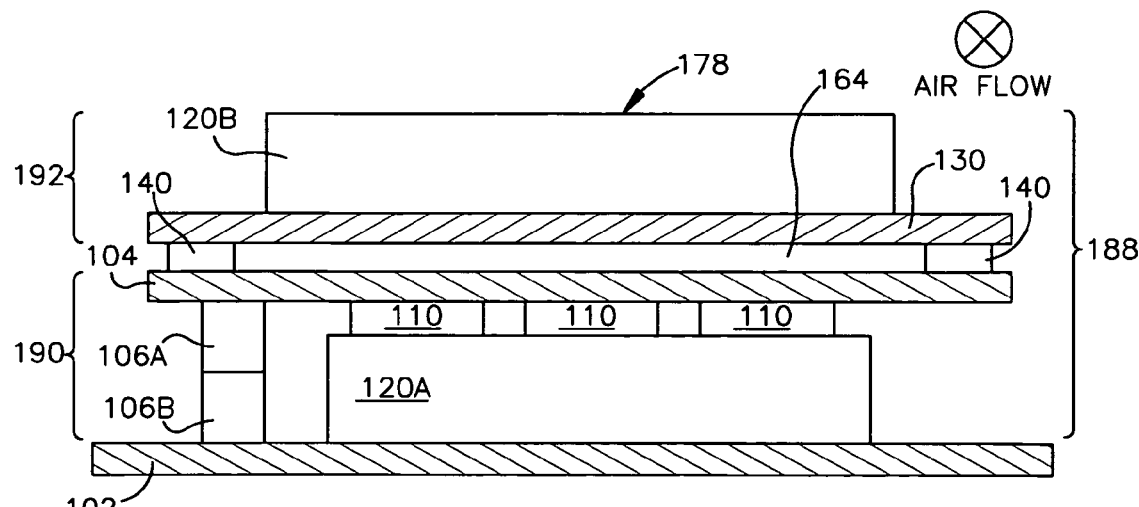
FIG. 2 is a side view of the electronic assembly of FIG. 1 with the electronic assembly being assembled together.
Figure 3:
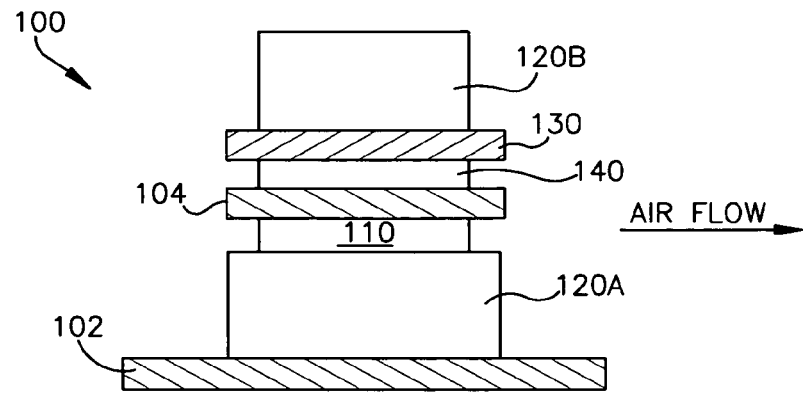
FIG. 3 is an end view of FIG. 2.

FIGS. 1-3 show an electronic system or assembly 100 in accordance with an exemplary embodiment of the present invention. The electronic assembly 100 includes two printed circuit boards (PCB) or printed wiring boards (PWB) 102 and 104. The PCBs 102 and 104 can have a variety of configurations and still be within embodiments in accordance with the invention. By way of example, the PCBs can include power module circuit boards, voltage regulation module (VRM) circuit boards, controller boards (such as a special type of expansion board that contains a controller for a peripheral device), expansion boards (such as any board that plugs into an expansion slot of a computer), or modules. As another example, the PCB 102 can be a motherboard, and the PCB 104 can be a daughterboard.

A motherboard is a printed circuit board that can be used in a personal computer, server, or other electronic device. The motherboard (also known as a main board or system board) can provide attachment points for processors, graphics cards, sound cards, controllers, memory, integrated circuits (ICs), modules, PCBs, and many other electronic components and devices in a computing system. The daughterboard can be utilized as an extension of the motherboard or other card or board. The daughterboard can have plugs, sockets, pins, connectors, or other attachments for the motherboard or other boards. Connectors 106A and 106B, for example, can be used to electrically couple the PCB 102 to the PCB 104. Connectors 106 provide a mechanical and electrical interface or connection between the PCBs and may include, for example, a removably connectable plug (male) and socket (female). Alternatively, a single connector can be used to connect the PCBs 102 and 104. Further, a connection mechanism between PCBs 102 and 104 can be located at various positions, such as, but not limited to, the sides and/or ends of the PCBs. Further yet, soldering can be used in place of or in conjunction with any connection.

The PCBs 102 and 104 include a plurality of electronic components or devices. For example, the PCB 104 includes a plurality of heat-generating components or devices 110. These heat-generating devices include any electronic component that generates heat during operation. For example, heat-generating devices include, but are not limited to, electronic power circuits, integrated circuits (ICs) or chips, digital memory chips, application specific integrated circuits (ASICs), processors (such as a central processing unit (CPU) or digital signal processor (DSP)), discrete electronic devices (such as field effect transistors (FETs)), other types of transistors, or devices that require heat to be thermally dissipated from the device for the device to operate properly or within a specified temperature range. An ASIC can comprise an integrated circuit or chip that has functionality customized for a particular purpose or application. The PCBs 102 and 104 and/or power system 130 can also include a plurality of electronic components or device that may or may not generate heat, that may generate low or insignificant amounts of heat, or that may generate heat but not require the generated heat to be thermally dissipated from the device for the device to operate properly or within a specified temperature range. Examples of such devices include, but are not limited to, resistors, capacitors, transistors, diodes, memories, etc.

The electronic assembly 100 includes at least one thermal solution or thermal dissipation device 120A, and optionally includes a second thermal dissipation device 120B. Thermal dissipation devices include, but are not limited to, heat spreaders, cold plates or thermal-stiffener plates, refrigeration (evaporative cooling) plates, heat pipes, mechanical gap fillers (such as a plurality of rods, pins, etc.), thermal pads, or other devices adapted to dissipate heat. Further, thermal dissipation devices include thermal compounds and thermal interface material that can be used to form a thermally conductive layer on a substrate, between electronic components, or within a finished component. For example, thermally conductive resins, tapes, molded thermoplastic compounds, adhesives, gap pads, and greases can be used between a heat-generating device and thermal dissipating device to improve heat dissipation and/or heat transfer. Further, thermal dissipation devices include heatsinks. A heatsink is a component designed to reduce the temperature of a heat-generating device or component, such as heat-generating components 110. A heatsink, for example, can dissipate heat in a direct or indirect heat exchange with the electronic components, the heat being dissipated into surrounding air or surrounding environment. Numerous types of heatsinks can be utilized with embodiments in accordance with the present invention. For example, embodiments can include heatsinks without a fan (passive heatsinks) or heatsinks with a fan (active heatsink). Other examples of heatsinks include extruded heatsinks, folded fin heatsinks, cold-forged heatsinks, bonded/fabricated heatsinks, and skived fin heatsinks. Further, the thermal dissipation device, including heatsinks, can use liquids or phase change material. For example, the thermal dissipation device can conduct heat from heat-generating devices to a heatsink that is liquid or air cooled. Furthermore, liquid pipes or liquid loops can be used to evacuate or transfer heat from the thermal dissipation device or module to an external location that is remote from the thermal dissipation device or module.

The electronic assembly 100 also includes at least one power supply or power system 130. Electrical connectors or power coupling devices 140 connect the respective power system 130 to the PCB 104. FIGS. 1-3 show one connector 140 located at each end or corner of the PCB 104 and/or power system 130. Although two connectors 140 are shown, embodiments in accordance with the invention are not limited to a particular number, type, or location of connectors. For example, a single connector or multiple connectors can be used to couple the power system 130 to the PCB 104. Alternatively, the connectors can be located at various positions, such as, but not limited to, the sides, middle, and/or ends of the PCB 104 and/or power system 130.

The power system 130 can include numerous embodiments for providing power to electronic components (such as heat-generating components 110) and/or PCBs (such as the PCB 104) within the electronic assembly 100. For example, the power system can be a factorized power architecture (FPA) module, a power converter, such as a direct current (DC) converter or DC-DC converter, DC linear regulator, AC-DC converter, DC switching regulator, or DC charge pump.

The power system 130 can be configured as PCBs, power module assemblies, power circuit cards/boards, and/or power module PCBs. As shown in FIGS. 1-3, the power system 130 is disposed in a parallel and vertically stacked-up relationship with the thermal dissipation devices 120A, 120B and PCBs 102 and 104. In one exemplary embodiment, the power system 130 and PCB 104 are parallel and separated by a distance approximately equal to a thickness of connectors 140. As shown in FIG. 2, a small space 164 exists between one surface of the power system 130 and one surface of the PCB 104. In one exemplary embodiment, this space 164 can be filled with a thermally conductive gap filler.

The power system 130 may be modular and replaceable. In some embodiments, the power system 130 is an independently-operable unit or module that can be constructed with standardized units or dimensions for flexibility and replaceability for use in the electronic assembly 100. Further, the power system 130 can be connected to or removed from the electronic assembly (example, the PCB 104) without connecting, removing, or replacing other components in the electronic assembly 100 (example, the heat-generating components 110, PCB 104, and/or thermal dissipation device 120A). As such, the power system 130 can be serviced (example, replaced or repaired) independently of the PCB 102 or the PCB 104 and/or heat generating components 110. By way of illustration, suppose for example that power system 130 fails or otherwise needs to be replaced or upgraded. The power system 130 can be disconnected from the connectors 140 and disconnected and removed from the PCB 104 without removing or replacing the heat-generating components 110 and/or the PCBs 102 and 104. Alternatively, if the thermal dissipation device 120B is utilized, it could be simultaneously removed with the power system 130 or removed before the power system 130 is removed.

The PCB 104 may be modular and replaceable. In some embodiments, the PCB 104 is an independently-operable unit or module that can be constructed with standardized units or dimensions for flexibility and replaceability for use in the electronic assembly 100. Further, the PCB 104 can be connected to or removed from the electronic assembly (example, the PCB 102 and/or power system 130) without connecting, removing, or replacing other components in the electronic assembly 100. As such, the PCB 104 can be serviced (example, replaced or repaired) independently of the PCB 102 or the power system 130 and/or thermal dissipation device 120. By way of illustration, suppose for example that the PCB 104 fails or otherwise needs replaced or upgraded. The PCB 104 can be disconnected and removed from the PCB 102 and/or power system 130. Once the PCB 104 is removed, heat-generating components 110 could, for example, be repaired or replaced, and the PCB 104 then re-attached or re-connected to the PCB 102 and the power system 130.

Once connected, the PCB 104 is sandwiched between the PCB 102 and the power system 130. Further, the PCBs 102 and 104 and power system 130 are spaced apart, parallel, and mechanically and electrically connected to form a vertical stacked-up configuration. As shown in FIGS. 1-3, the electronic assembly 100 comprises at least three different vertically stacked layers, with each layer being separated from the other layers. A first or top layer includes the power system 130; a second or middle layer includes the PCB 104; and a third or bottom layer includes the PCB 102. The thermal dissipation device 120A is disposed between the second and third layers and can, in some embodiments, form part of either the second layer or the third layer.

In one exemplary embodiment, the thermal dissipation device 120A substantially fills a volume of space that extends above a top surface of the heat-generating components 110 and that extends underneath the PCB 104 and above the PCB 102. As shown for example in FIGS. 1 and 2, a portion of the top side 166 of the thermal dissipation device 120A extends along all of or substantially all of the surface area (length×width) of an underside 168 of the PCB 104. A bottom side 170 of the thermal dissipation device 120A extends along a top side 172 of PCB 102.

In one exemplary embodiment, a bottom portion or bottom surface 174 of the thermal dissipation device 120B extends along all of or substantially all of a surface area (length×width) of a top side 176 of power system 130.

Although FIGS. 1-3 illustrate the PCB 104, power system 130, and thermal dissipation devices 120A, 120B as being one-piece, embodiments in accordance with the invention are not limited to being one-piece, integrally formed, or the like. The PCB 104, power system 130, and thermal dissipation devices 120A, 120B can be formed as separate, distinct units or pieces that, for example, couple together or that electrically and/or mechanically communicate with each other.

The thermal dissipation devices 120A, 120B can directly or indirectly attach to or contact with various layers and/or electrical components (such as the power system 130, the heat-generating components 110, and/or PCBs 102 and 104). For example, the thermal dissipation device 120B can directly contact the power system 130 so as to directly transfer or dissipate heat away from the power system. As another example, the thermal dissipation device 120A can directly contact both the heat generating components 110 and a portion of the surface of the PCB 102. Since the thermal dissipation device 120A is sandwiched between the PCBs 102 and 104, heat can transfer directly from both the heat generating components 110 and the PCB 102 to the thermal dissipation device 120A.

Heat can be conducted, exchanged, and dissipated through or from plural layers, devices, components, and/or modules in a variety of embodiments in accordance with the invention. For illustrations purposes, some of these exemplary embodiments are discussed in connection with FIGS. 1-3.

As one example, heat can be evacuated or dissipated for a module or layer from a common exit location or common surface area. Heat generated from the power system 130 can be conducted or transferred through the thermal dissipation device 120B and thereafter dissipated into the air or environment at a top surface 178. As another example, as heat is generated from heat-generating components 110, the generated heat is transferred from a top surface of the heat-generating components 110 and/or the PCBs 102 and 104 to the thermal dissipation device 120A. In this manner, the thermal dissipation device 120A can simultaneously dissipate heat from the heat-generating components 110 and PCBs 102 and 104.

Any surface (such as surface 178) of a thermal dissipation device can be enhanced to facilitate heat dissipate and/or heat exchange. For example, the surface can include fins, rods, pins, or other features. Further yet, any surface of any thermal dissipation device can be formed as a separate body or unit that mounts to the body of the thermal dissipation device.

Heat can be dissipated from the thermal dissipation devices 120A and 120B in a variety of ways. For example, one or both of the thermal dissipation devices 120A and 120B can be an active device that produces an airflow. For purposes of illustration only, the electronic assembly 100 is shown with an airflow direction as indicated with arrows (the airflow being into the page and indicated with a circle and "X"). The airflow can be provided, for example, with a fan or other device positioned within the electronic assembly 100 or within or proximate the thermal dissipation devices 120A and 120B. For example, the airflow can be generated from a system fan. The airflow is directed in a pathway that is parallel to the PCBs 102 and 104 and power system 130. Airflow, however, is not limited to any particular direction. In some embodiments, for example, the airflow can be directed in a perpendicular direction with respect to the PCB 102, PCB 104, power system 130, and/or heat-generating components 110. A primary airflow can thus be directed at, above, or below the PCBs 102 and 104, the heat-generating components 110, the power system 130, and/or the thermal dissipation devices 120A and 120B. Further, the primary airflow can be simultaneously directed to several different components/layers (such as the PCBs 102 and 104, the heat-generating components 110, the power system 130, and/or the thermal dissipation devices 120A, and 120B) or exclusively at individual components/layers. Thus, the same airflow can be used to cool or dissipate heat simultaneously from multiple layers and/or components or solely from a single layer and/or component.

The airflow can be utilized to assist or augment heat transfer or dissipation. In this regard, the electronic assembly 100 can utilize one or both of heat conduction and/or an airflow pathway to dissipate heat. The combinations of heat conduction and airflow to dissipate heat are numerous. By way of illustration, the thermal dissipation devices 120A and 120B can directly contact the heat-generating components 110 and/or PCBs 102 and 104 to conduct heat away from these components. At the same time, either or both thermal dissipation devices 120A and 120B could generate or be exposed to an airflow that is directed at both the PCBs 102, 104 and the thermal dissipation devices. For example, this airflow could be utilized to cool the PCB 104 (including heat-generating components) and the thermal dissipation device 120A as the thermal dissipation device conducts and dissipates heat away from the heat-generating components 110. Thus, the same thermal dissipation device simultaneously dissipates heat away from PCBs 102 and 104 and heat-generating components 110.

The thermal dissipation devices can utilize and/or comprise a remote heat exchanger (RHE). An RHE enables the thermal dissipation device to be remote from the heat-generating device (such as PCB 104, heat-generating components 110, and/or power system 130). For example, heat can be transferred from the heat-generating device to an attachment block having a heat pipe. Further, the heat pipe can be integral to the module or any portion of the electronic system (example, the thermal dissipation device) and extend outwardly from the electronic system to a remote heatsink. Alternatively, the heat pipe can attach to a surface of the module or system (example a surface of a thermal dissipation device) and then extend to a remote heatsink. The heat pipe, for instance, can be a hollow copper pipe containing a fluid and wicking material. Through a process of vaporization and re-condensation, heat travels through the heat pipe to a heat exchanger, such as a finned heat sink. Localized airflow can be used to evacuate the heat to the environment.

Looking to FIG. 1, one or both of the thermal dissipation devices 120A and 120B could be or could utilize a cold-plate and/or could utilize heat dissipation via heat pipes or liquids. The "In" and "Out" arrows signify liquid-in and liquid-out, respectively. As such, the thermal dissipation devices 120A and 120B can be coupled to a pump and/or a heat exchanger to circulate a cooling liquid through the thermal solution to cool any one or combination of PCBs, heat-generating components, power system, etc. The thermal dissipation devices 120A and 120B can be utilized in conjunction with one or both of the heat conduction and/or airflow cooling techniques discussed herein. As one example, the thermal dissipation devices 120A and 120B can include a separate piece or unit on a top or bottom surface. This separate piece could be a liquid cold plate, evaporator, refrigerator, heatsink, or other device or technology known in the art.

Embodiments in accordance with the invention are not limited to any number or type of thermal dissipation devices. Further, the thermal dissipation devices 120A, 120B can be coupled together. For example, a liquid heat pipe (or other device known in the art) could extend from the thermal dissipation device 120A to the thermal dissipation device 120B. This heat pipe would assist in removing heat from the thermal dissipation device 120A and heat-generating components 110 and transfer this heat to the thermal dissipation device 120B. Thereafter, the transferred heat could be dissipated in a variety of ways discussed herein, including but not limited to use of air, liquid cold plates, additional heat pipes, heat dissipation, etc.

Figure 4:
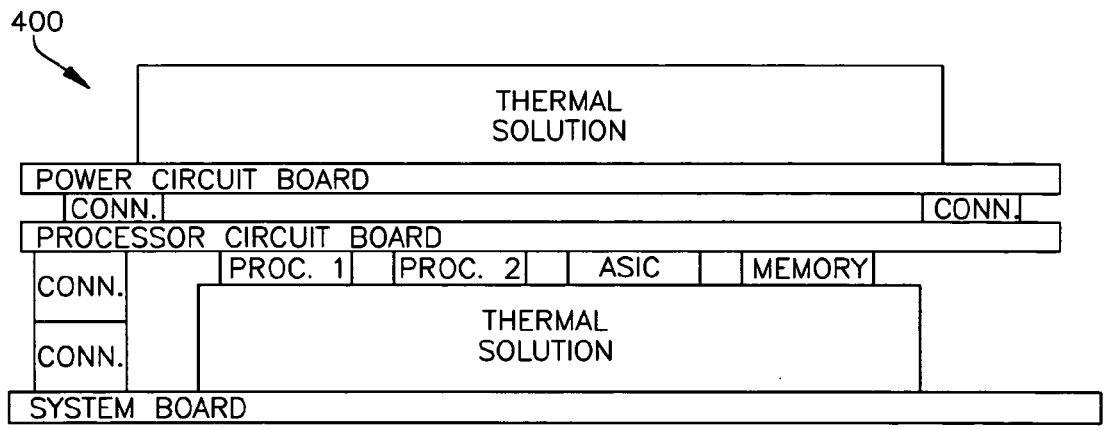
FIG. 4 is a side view of an exemplary embodiment of an electronic assembly being assembled together.
Figure 5:
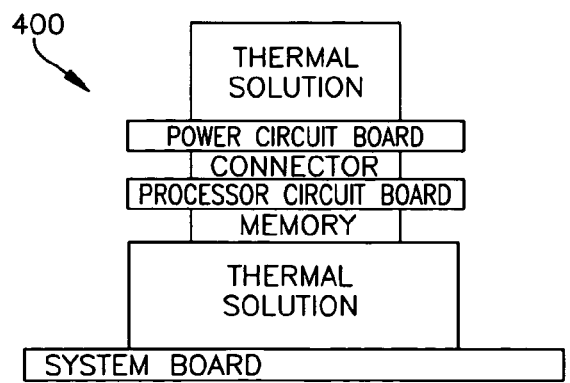
FIG. 5 is an end view of FIG. 4.

Various different electronic components, layers, and PCBs can be combined into different embodiments in accordance with the invention. FIGS. 4 and 5 illustrate one such exemplary embodiment as electronic assembly 400. In this figure, the processor circuit board can include (among other electrical components) at least one processor, memory, and ASIC. For example, the processor circuit board can have numerous electronic heat-generating components, such as plural processors, an ASIC, and memory, to name a few examples. A first side of the processor circuit board (example, the side including the heat generating components) is coupled, via a connector or connectors, to a system board. A first thermal dissipation device is disposed between the system board and the processor circuit board. This thermal dissipation device can dissipate heat away from both the heat generating components and the system board. A second side or back side of the processor circuit board is coupled, via a connector or connectors, to a power circuit board. A second thermal dissipation device is disposed above the power circuit board to dissipate heat away from the power circuit board. Further, this second thermal dissipation device can be coupled to the first thermal dissipation device to assist in heat transfer or heat dissipation.

Figure 6A:
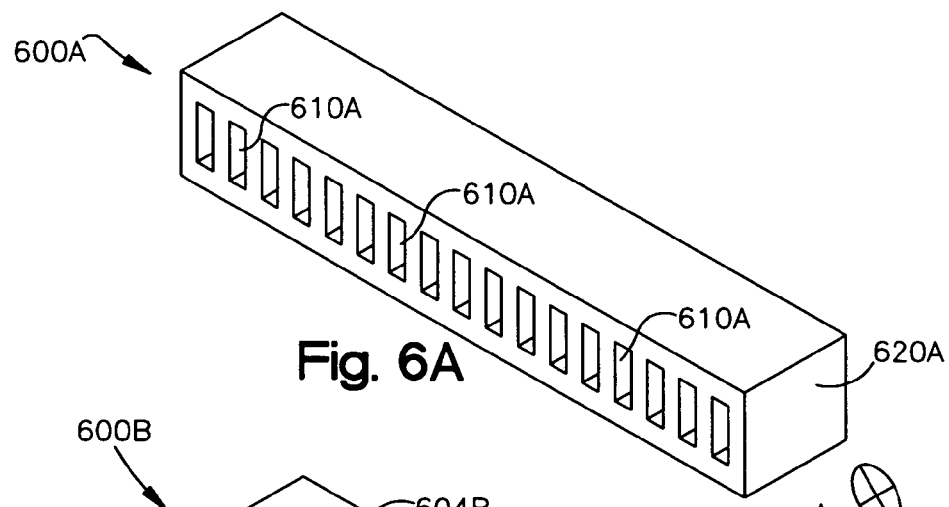
FIG. 6A is an exemplary embodiment of a thermal dissipation device.
Figure 6B:
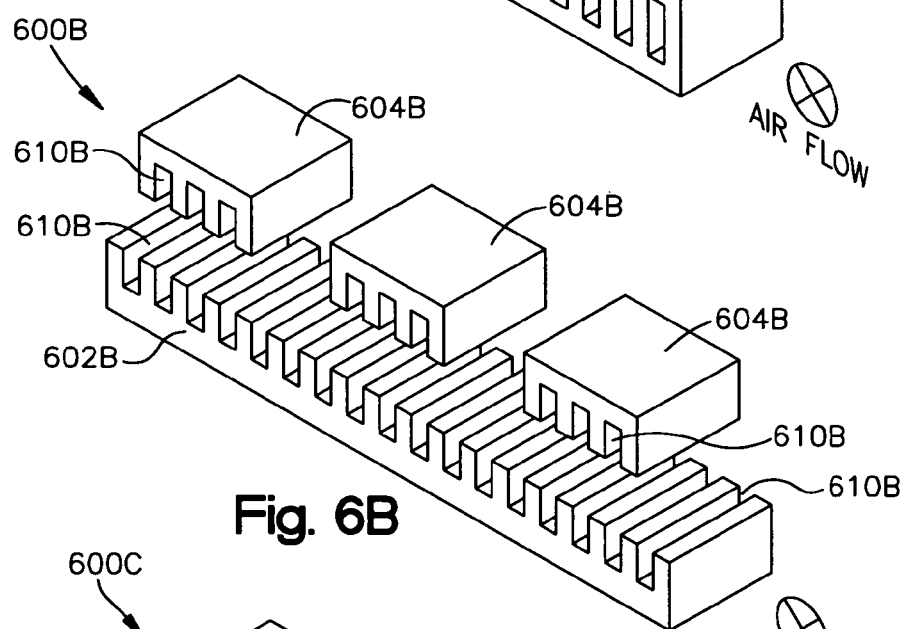
FIG. 6B is another exemplary embodiment of a thermal dissipation device.
Figure 6C:
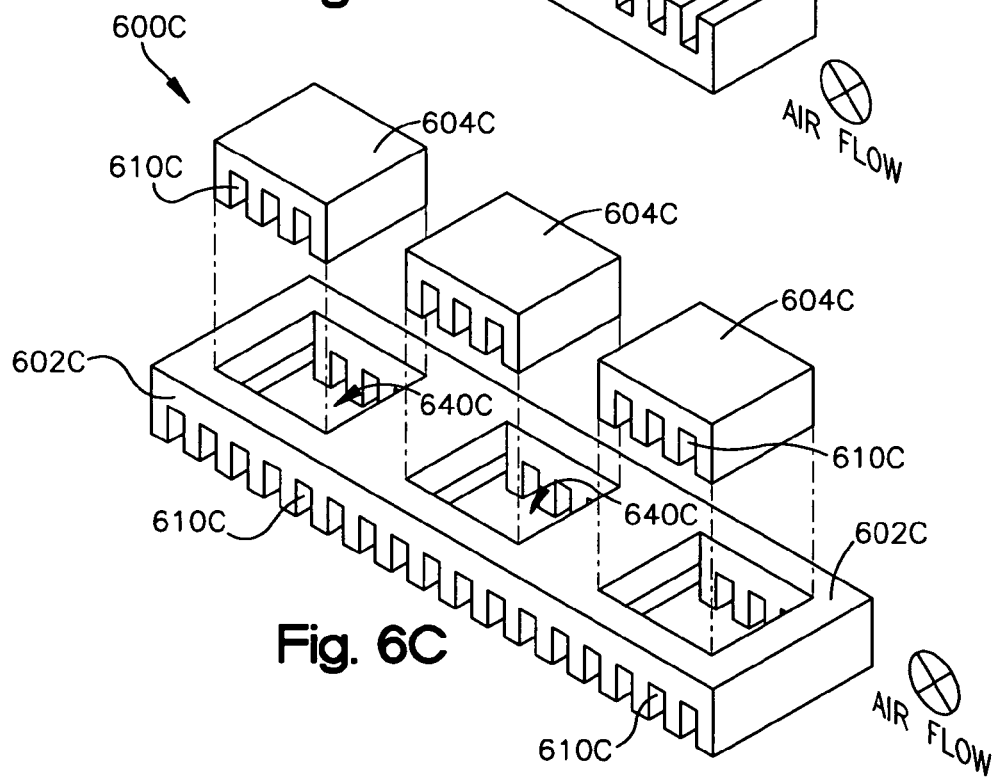
FIG. 6C is another exemplary embodiment of a thermal dissipation device.

As best shown in FIGS. 1 and 2, thermal dissipation devices 120A, 120B comprise a unitary or single member. Embodiments in accordance with the invention, though, can utilize a wide variety of types and number of thermal dissipation devices. For example, the thermal dissipation devices 120A, 120B can comprise a plurality of individual, separate members. Some examples of various embodiments that can be utilized in conjunction with the electronic assembly 100 are shown in FIGS. 6A to 6C. These examples illustrate a single airflow, but multiple airflows with various directions are within embodiments in accordance with the invention.

FIG. 6A shows a thermal dissipation device 600A having a plurality of openings 610A that extend through a body portion 620A. The openings 610A can have a variety of configurations and/or shapes and include slots, holes, etc. and can be formed from adjacent pins, rods, fins, etc. The openings 610A enable an airflow (the airflow being into the page and indicated with a circle and "X") to pass through the thermal dissipation device 600A.

FIG. 6B shows another example of a thermal dissipation device 600B formed from a base component 602B and a plurality of other separate components 604B. The base and separate components have a plurality of openings 610B. The openings 610B can have a variety of configurations and/or shapes and include slots, holes, etc. and can be formed from adjacent pins, rods, fins, etc. The openings 610B enable an airflow (the airflow being into the page and indicated with a circle and "X") to pass through the thermal dissipation device 600B.

FIG. 6C shows another example of a thermal dissipation device 600C formed from a base component 602C and a plurality of other separate components 604C. The base and separate components have a plurality of openings 610C. The separate components 604C are separate and removable from the base portion 602C and extend through holes or openings 640C in the base portion 602C. The openings 610C can have a variety of configurations and/or shapes and include slots, holes, etc. and can be formed from adjacent pins, rods, fins, etc. The openings 610C enable an airflow (the airflow being into the page and indicated with a circle and "X") to pass through the thermal dissipation device 600C.

Embodiments in accordance with the present invention can utilize a modular connective architecture. If a particular electronic component (including PCBs) or device fails or otherwise needs to be replaced, the electronic component can be removed from the module or the electronic assembly and replaced with a new and/or different component. As such, the electronic assemblies can be constructed with standardized electronic components and/or dimensions to enable flexibility and variety of use and exchange of components. Looking to FIGS. 4 and 5 as an example, if the second thermal solution or power circuit board fails or needs to be replaced, the second thermal solution and the power circuit board can be disconnected and/or removed from the electronic assembly while the processor circuit board and corresponding heat generating components remain connected to the system board. Thereafter, a new and/or different second thermal solution and/or power circuit board can be connected to the electronic assembly. As such, expensive heat-generating components (such as processors, memories, ASICs, etc.) can remain unchanged and do not need to be removed or replaced when the power circuit board and/or second thermal solution are removed or replaced. As another example, if the processor circuit board fails or needs to be replaced, the processor circuit board and accompanying power circuit board can be disconnected or uncoupled from the system board and removed from the electronic assembly while the heat generating components remain connected to the processor circuit board. Thereafter, the first thermal solution could be repaired or replaced. Alternatively, a new and/or different processor circuit board and/or heat generating components could be repaired or replaced.

As used herein, the term "module" means a unit, package, or functional assembly of electronic components for use with other electronic assemblies or electronic components. A module may be an independently-operable unit that is part of a total or larger electronic structure or device. Further, the module may be independently connectable and independently removable from the total or larger electronic structure.

The configuration or arrangement of electronic components, layers, and/or modules shown in the figures saves weight, space, and costs since the components and/or layers are efficiently spaced and additional thermal dissipation devices are not required. For example, embodiments in accordance with the present invention can utilize a variety of modules. Looking to FIGS. 1-3, the PCB 104 can be a processor module 192 that includes heat-generating components 110 (such as plural separate processors, an ASIC, and memory all on the same board or card). The processor module 192 may or may not include the thermal dissipation device 120A. As another example, the power system 130 can form a power system module 190 that may or may not include the thermal dissipation device 120B. The power system module 190 can vertically stack and connect or coupled, via connectors 140, to the processor module. Together, the power system module, connector, processor module, and optional thermal dissipation devices form a processor/power module 188 that can be removably connected to, for example, the PCB 102. FIGS. 1-3, for example, show such a processor/power module connected, via connectors 106A and 106B, to PCB 102. Further, the power system 130 and/or power module can provide a power source that is proximally close to the load (example the PCB 104) in order to minimize noise and optimize step load performance.

In one exemplary embodiment, the processor/power module 188 (FIG. 2) can comprise two halves that mechanically and electrically connect or couple together. A first half includes the power system module, shown for example as 190 in FIGS. 1 and 2. The power system module can include the power system 130 with or without the thermal dissipation device 120B. A second half includes the processor module, shown for example as 192 in FIGS. 1 and 2. The processor module 192 includes the heat-generating components 110 and may or may not include the thermal dissipation device 120A. In order to assemble the processor/power module 188, the first half (i.e., the power system module 190) is coupled or connected to the second half (i.e., the processor module 192). Thereafter, the processor/processor module 188 is connected to the PCB 102. Various connectors can be used to couple the first and second halves together and to the PCB 102. As best shown in FIGS. 1-3, the power system 130 and the PCB 104 are sandwiched between the thermal dissipation devices 120A and 120B. Further, as shown, when the processor/power module is assembled, the heat-generating components 110 are positioned inside a housing of the processor/power module itself, and the power system 130 and the PCB 104 are positioned back-to-back.

The processor/power module can have various configurations. For illustration purposes (as shown in FIGS. 1-3), the processor/power module has a general rectangular configuration. A top surface is formed from one outer surface of the power system 130 or, optionally, the thermal dissipation device 120B. A bottom surface is formed from one outer surface of the thermal dissipation device 120A.

In order to facilitate modularity within the electronic assembly, various removable connections between electronic components can be utilized. By way of example, such connections include, but are not limited to, land grid arrays (LGAs), pin grid arrays (PGAs), plugs (example, male), sockets (example, female), pins, connectors, soldering, or other removable or disconnectable attachments.

A module can include a variety of different heat exchanging or heat transferring interfaces (such as the interface between two thermal dissipation devices or the interface between a thermal dissipation and a PCB or a heat-generating component). These interfaces can be adapted to enhance heat conduction or heat exchange. For example, the interfaces can include conductive resins, tapes, adhesives, gap pads, greases, or any other device or compound that facilitates or improves heat conduction.

Embodiments in accordance with the invention can be utilized in a wide variety of different methods and embodiments. For example, embodiments in accordance with the present invention can utilize embodiments taught in U.S. patent application Ser. No. 10/800,837 filed Mar. 15, 2004, entitled "Multi-Processor Module" and incorporated herein by reference. As another example, an exemplary method can comprise connecting plural heat-generating components to a first circuit board. The heat-generating components can include plural separate processors (example processors formed on separate dies), ASICs, memories, and other devices. A power system can be connected in a vertical stacked-up configuration to the first circuit board. One or more power connectors can couple the power system to the first circuit board. A thermal dissipation device is disposed above or along one surface of the power system, and another thermal dissipation device is disposed between the first circuit board and a second circuit board. The thermal dissipation devices thermally dissipate heat away from both the first circuit board (including the heat-generating components), the power system, and the second circuit board. The thermal dissipation device can simultaneously dissipate heat (for example via a direct heat exchange) from both the first circuit board (including the heat-generating components) and the power system. Additionally, the thermal dissipation device can comprise, utilize, or generate a liquid exchange flow or a flow of air in an airflow pathway. The airflow pathway can be directed to any one of or any combination of the first and second circuit boards, the power system, the thermal dissipation devices, and/or the heat-generating components. Further, a liquid flow can be utilized to remove, dissipate, or transfer heat away from PCBs, the thermal dissipation devices, the power system, or heat-generating components. Together, the power system, first circuit board, thermal dissipation device, and heat-generating components form a processor/power module. This module can be connected to the second circuit board (such as a system board or motherboard) and arranged, for example, in a vertically stacked-up configuration. The components within the processor/power module (such as the thermal dissipation devices, the PCB, the processors, the memory, the ASIC, and/or the power system) can be individually or jointly repaired or replaced while other components and/or layers or the module remain mechanically and/or electrically coupled to the second circuit board. The revised power/processor module can then be re-connected to the second circuit board.

One skilled in the art will appreciate that a discussion of various methods should not be construed as steps that must proceed in a particular order. Additional steps may be added, some steps removed, or the order of the steps altered or otherwise changed.

While the invention has been disclosed with respect to a limited number of embodiments, those skilled in the art will appreciate, upon reading this disclosure, numerous modifications and variations. It is intended that the appended claims cover such modifications and variations and fall within the true spirit and scope of the invention.

What is claimed is:

1. An electronic module removably connectable to a system board, the electronic module comprising:
   a first portion connected to the system board and including a thermal dissipation device and a printed circuit board (PCB) with a processor connected to a first side of the PCB, the thermal dissipation device extending between the processor and the system board; and
   a second portion connected on top of the first portion, the second portion having a power system board for providing power to the processor, the power system board extending adjacent and parallel to a second side of the PCB.

2. The electronic module of claim 1 wherein the thermal dissipation device forms one side of the electronic module and the power system board forms an opposite side of the electronic module.

3. The electronic module of claim 1 wherein the PCB includes a second processor connected to the first side of the PCB, and the thermal dissipation device extends between both processors and the system board.

4. The electronic module of claim 1 wherein the thermal dissipation device directly contacts the processor and the system board for dissipating heat directly away from the processor and the system board.

5. The electronic module of claim 1 further comprising a second thermal dissipation device connected to the power system board, wherein the thermal dissipation device forms one side of the module and the second thermal dissipation device forms another, opposite side of the module.

6. The electronic module of claim 1 wherein the PCB has a second side, opposite the first side, and the second side is back-to-back with one side of the power system board.

7. The electronic module of claim 1 wherein heat generated by the processor is conducted, via a heat pipe, from the thermal dissipation device.

8. The electronic module of claim 1 wherein the second portion is removable from the first portion while the first portion remains connected to the system board.

9. The electronic module of claim 1 wherein the thermal dissipation device substantially fills a volume of space formed underneath the first side of the PCB.

10. A method, comprising:
    connecting a first portion of an electronic module to a printed circuit board (PCB), the first portion having a thermal dissipation device and a processor board with plural processors;
    connecting a second portion of the electronic module on top of the first portion so a power board in the second portion is back-to-back with the processor board;
    dissipating heat away from the plural processors with the thermal dissipation device; and
    dissipating heat, with the thermal dissipation device, from the PCB and from other heat-generating components on the processor board.

11. The method of claim 10 further comprising dissipating heat from the thermal dissipation device using liquid heat exchange.

12. The method of claim 10 further comprising dissipating the heat from the first portion using a liquid cold plate.

13. The method of claim 10 further comprising disconnecting the second portion from the first portion while the first portion remains connected to the PCB.

14. The method o:f claim 10 further comprising:
    providing DC power from the second portion to the first portion;
    providing processing functionality from the first portion to the PCB;
    dissipating heat from the first and second portions with the thermal dissipation device.

15. A method, comprising:
    connecting a first portion of an electronic module to a printed circuit board (PCB), the first portion having a thermal dissipation device and a processor board with plural processors;
    connecting a second portion of the electronic module on top of the first portion so a power board in the second portion is back-to-back with the processor board;
    dissipating heat away from the plural processors with the thermal dissipation device; and
    dissipating heat away from the power board with another thermal dissipation device.

16. An electronic module connectable to a system board, the electronic module, comprising:
    a circuit board having at least one processor and memory;
    a power board coupled, to form a vertically stacked-up configuration, to the circuit board for providing power to the circuit board; and
    a thermal dissipation device disposed between the circuit board and the system board, wherein the thermal dissipation device contacts the processor for dissipating heat away from the processor.

17. The electronic module of claim 16 wherein the thermal dissipation device substantially fills a volume of space between the circuit board and the system board.

18. The electronic module of claim 16 wherein:
    the electronic module has a rectangular configuration;
    the thermal dissipation device forms a first side of the electronic module;
    the power board forms a second side, opposite the first side, of the electronic module;
    the thermal dissipation device dissipates heat, via a direct heat exchange, away from both the processor and the system board.

19. The electronic module of claim 16 further comprising a second thermal dissipation device coupled, to form a vertically stacked-up configuration, to the power board.

* * * * *

UNITED STATES PATENT AND TRADEMARK OFFICE
CERTIFICATE OF CORRECTION

PATENT NO. : 7,327,569 B2  Page 1 of 1
APPLICATION NO. : 11/011328
DATED : February 5, 2008
INVENTOR(S) : Christian L. Belady et al.

It is certified that error appears in the above-identified patent and that said Letters Patent is hereby corrected as shown below:

Column 11, line 49, in Claim 10, delete "lop" and insert -- top --, therefor.

Column 12, line 9, in Claim 14, delete "o:f" and insert -- of --, therefor.

Signed and Sealed this

Twenty-fourth Day of June, 2008

JON W. DUDAS
*Director of the United States Patent and Trademark Office*